United States Patent
Kusukawa et al.

(10) Patent No.: US 7,355,127 B2
(45) Date of Patent: Apr. 8, 2008

(54) PRINTED WIRING BOARD AND ELECTRONIC DEVICE USING THE SAME

(75) Inventors: Junpei Kusukawa, Hitachinaka (JP); Ryozo Takeuchi, Hitachi (JP)

(73) Assignee: Renesas Technology Corporation, Tokyo (JP)

( * ) Notice: Subject to any disclaimer, the term of this patent is extended or adjusted under 35 U.S.C. 154(b) by 1096 days.

(21) Appl. No.: 10/437,901

(22) Filed: May 15, 2003

(65) Prior Publication Data

US 2003/0213616 A1 Nov. 20, 2003

(30) Foreign Application Priority Data

May 16, 2002 (JP) ............... 2002-141160

(51) Int. Cl.
*H05K 1/16* (2006.01)
(52) U.S. Cl. .................. 174/260; 174/261; 361/777
(58) Field of Classification Search ........... 174/255, 174/261, 260; 361/777–779
See application file for complete search history.

(56) References Cited

U.S. PATENT DOCUMENTS 5,523,697 A * 6/1996 Farnworth et al. ......... 324/758
5,703,331 A * 12/1997 Brodsky et al. ........... 174/254
5,998,739 A * 12/1999 Shirai ...................... 174/256
7,067,907 B2 * 6/2006 Koschmieder et al. ..... 257/678

FOREIGN PATENT DOCUMENTS

DE 3640760 A1 6/1988
JP 2000208936 7/2000

* cited by examiner

*Primary Examiner*—Jeremy C Norris
(74) *Attorney, Agent, or Firm*—Mattingly, Stanger, Malur & Brundidge, P.C.

(57) ABSTRACT

The present invention provides a printed wiring board which has high insulation resistance between wirings and is unlikely to cause failures such as leakages or short circuits, attributable to ion migration even in high temperatures and highly humid environments. The printed wiring board has a circuit comprising a metal conductor on base metal layers created by forming an insulating resin layer 4 on at least one face of an insulating substrate 1 and forming the base metal layers 2 and 5 on the insulating resin layer. In the printed wiring board, at least a part of an upper face of the insulating resin layer existing in spaces 11 between the metal conductors is formed at a position lower than the interface between the base metal layer 5 and the insulating resin layer 4.

3 Claims, 10 Drawing Sheets

PRINTED WIRING BOARD AND ELECTRONIC DEVICE USING THE SAME

BACKGROUND OF THE INVENTION

1. Technical field

The present invention relates to a printed wiring board and an electronic device using the same, such as a semiconductor device and a multi chip module.

2. Background Art

In recent years, electronics devices such as notebook-sized personal computers, digital cameras, video cameras, and personal digital assistants (PDA) including mobile phones have become increasingly smaller, lighter, and more sophisticated. As a result, there is a need for higher density in printed wiring boards, which support and fix electronic components constituting the above devices and form a circuit, semiconductor devices such as BGA (Ball Grid Array)/CSP (Chip Scale Package) using printed wiring boards, or multi chip modules.

In order to deal with this densification trend, new wiring boards such as build-up substrates and glass substrates have been suggested and already put into practice.

As one example of such a wiring board, FIG. 9 shows a schematic cross-sectional view of a printed wiring board forming two wiring layers on one side of an insulating substrate.

Basically, a base metal layer 2 and a metal conductor 3 are formed on the surface of an insulating substrate 1, on the top of which an insulating resin layer 4 (interlayer insulating layer) is formed. Further, on top of this a base metal layer 5 and a metal conductor 6 are formed, and a protective insulating resin layer 7 is formed thereon.

In FIG. 9 shows a case wherein a printed wiring board has base metal layers 2 and 5, but these layers may not be formed depending on production methods.

One example of these methods for producing a printed wiring board will be explained based on FIG. 12. First, as shown in FIG. 12(a), a base metal layer 2 is formed on the surface of an insulating substrate 1. The base metal layer 2 is formed for imparting continuity to conduct electroplating or the like and for enhancing adhesiveness between the insulating substrate 1 and the metal conductor 3. As a base metal material, a metal such as chrome, which has good adhesiveness to the insulating substrate and insulating resin layer, is preferred, although the base metal material is not particularly limited thereto.

Examples of formation methods include vacuum evaporation, spattering, and electroless deposition, any of which may be employed. Further, when the metal conductor 3 is formed by electroless deposition, the base metal layer 2 is not necessary.

Next, in FIG. 12(b), a resist 9 is formed by spin coat method, etc., and the exposure and development is carried out using a pattern mask so that the resist 9 having a negative pattern of a desired circuit pattern is obtained.

Next, in FIG. 12(c), using the base metal layer 2 as an electrode, electroplating enables the metal conductor 3 to grow on portions where the resist 9 is not formed, thereby obtaining a desired circuit. Further, in FIG. 12(d), the resist 9 is removed with a chemical, or by other means Then, in FIG. 12(e), the base metal layer 2 is removed with a chemical, etc., except for a portion of the base metal layer 2 on which the metal conductor 3 is formed.

In FIG. 12(f), an insulating resin such as polyimide is applied by spin coat method, etc. to form an insulating resin layer 4 (interlayer insulating layer). Then, a first layer of wiring is completed.

Subsequently, in the processes (g) to (l) of FIG. 12, a second layer of wiring is formed in the same manner as in the processes (a) to (f). Moreover, when it is desired to increase wiring layers, the processes (g) to (l) may be repeated. Although not shown in FIGS. 9 and 12, a via hole or a through hole may be formed to establish the continuity between the first and second layers. The continuity between wiring layers leads to the completion of a printed wiring board.

With respect to the printed wiring board fabricated by the above method, when spaces 11 between metal conductors (wiring) are made smaller (fine pitch) for densification, it is found that there is the fear that the following problems will arise. FIGS. 10 and 11 are enlarged views of Portion A of a printed wiring board of FIG. 9, and the above problems are described in detail by way of FIGS. 10 and 11.

When the printed wiring board fabricated by the method of FIG. 12 has smaller spaces 11 between metal conductors (wiring) as shown in FIG. 10, it becomes difficult to remove the base metal layers 2 and 5 in the processes (e) and (k) of FIG. 12. These processes involve removing the unnecessary portion of the base metal layer 2 except for the circuit on the insulating substrate 1, and removing the unnecessary portion of the base metal layer 5 except for the circuit on the insulating resin layer 4 (interlayer insulating layer). Therefore, the base metal layers remain between wirings (remaining base metal layer 12).

This remaining base metal layer 12 reduces the insulation resistance value of spaces 11 between metal conductors (wiring). Further, when the base metal layers 2 and 5 are formed by spattering, etc., the base metal layers are embedded in the insulating substrate 1 and the insulating resin layer 4 (interlayer insulating layer) and thus the insulation resistance value tends to be lower.

Moreover, even if the base metal layers 2 and 5 are completely removed, chemicals such as etchants remain in spaces 11 between metal conductors (wiring) and become ionic impurities 13. As a result, the insulation resistance values of the spaces 11 between metal conductors (wiring) are lowered. This is a first major problem.

In addition, when voltage is applied to the spaces 11 between metal conductors (wiring) as shown in FIGS. 9 and 11 in a high temperature and in a highly humid environment, the base metal layers 2 and 5, and the metal conductors 3 and 6, are melted and ionized. The ions migrate on an interface portion between the insulating substrate 1 and the insulating resin layer 4 (interlayer insulating layer) or on an interface portion between the insulating resin layer 4 (interlayer insulating layer) and the protective insulating layer 7 (ion migration 15). As a result, deterioration phenomena such as electrical leakages or short circuits between wirings occur. This is a second major problem.

Incidentally, as a method for improving the insulation property between wirings, JP Patent Publication (Unexamined Application) No. 2000-183468suggests the formation of projecting ribs or recessed grooves on a joint resin surface.

However, the suggestion of this application aims at improving the insulation property of a resin molded wiring board (mold wiring board), which is prepared by insert-molding a metal frame with a resin. The wiring board disclosed in the above publication completely differs from the high-density printed wiring board that is covered by the present invention and manufactured by additive process, semi-additive process, and subtractive process in terms of production process, wiring density, etc. Thus, the wiring board of the above publication does not suffer any of the above problems because of its production process.

An object of the present invention is to solve the above first and second problems and provide a printed wiring board that has high insulation resistance value between metal conductors (wiring) and is unlikely to cause failures such as electrical leakages or short circuits due to ion migration or the like.

A further object of the present invention is to provide an electronic device using the above printed wiring board, such as a semiconductor device or a multi chip module.

SUMMARY OF THE INVENTION

The summary of the present invention to accomplish the above objects is as follows.

(1) A printed wiring board comprising a metal conductor (wiring) created by forming a resist on at least one face of an insulating substrate and providing a metal on a portion other than the resist (by an additive process),
  wherein at least a part of an upper surface of the insulating substrate between the metal conductors (wiring) is formed at a position lower than the interface between the metal conductor (wiring) and the insulating substrate.

(2) A printed wiring board comprising a metal conductor (wiring) created by forming a metal layer on at least one face of an insulating substrate and removing the metal layer except for the portion thereof that is to be the metal conductor (wiring) (by a subtractive process),
  wherein at least a part of an upper surface of the insulating substrate between the metal conductors (wiring) is formed at a position lower than the interface between the metal conductor (wiring) and the insulating substrate.

(3) A printed wiring board comprising a metal conductor (wiring) obtained by forming a base metal layer on at least one face of an insulating substrate, forming a resist on the base metal layer, providing a metal on a portion other than the resist, removing the resist, and removing the base metal layer except for the portion thereof that is to be a metal conductor (wiring) (by a semi-additive process),
  wherein at least a part of an upper surface of the insulating substrate between the metal conductors (wiring) is formed at a position lower than the interface between the base metal layer and the insulating substrate.

(4) A printed wiring board comprising a metal conductor (wiring) created by forming an insulating resin layer on at least one face of an insulating substrate, forming a resist on the insulating resin layer, and providing a metal on a portion other than the resist (by an additive process),
  wherein at least a part of an upper surface of the insulating resin layer between the metal conductors (wiring) is formed at a position lower than the interface between the metal conductor (wiring) and the insulating resin layer.

(5) A printed wiring board comprising a metal conductor (wiring) created by forming an insulating resin layer on at least one face of an insulating substrate, forming a metal layer on the insulating resin layer, and removing the metal layer except for the portion thereof that is to be the metal conductor (wiring) (by a subtractive process),
  wherein at least a part of an upper surface of the insulating resin layer between the metal conductors (wiring) is formed at a position lower than the interface between the metal conductor (wiring) and the insulating resin layer.

(6) A printed wiring board comprising a metal conductor (wiring) created by forming an insulating resin layer on at least one surface of an insulating substrate, forming a base metal layer on the insulating resin layer, forming a resist on the base metal layer, providing a metal on a portion other than the resist, removing the resist, and removing the base metal layer except for the portion thereof that is to be the metal conductor (wiring) (by a semi-additive process),
  wherein at least a part of an upper surface of the insulating resin layer between the metal conductors (wiring) is formed at a position lower than the interface between the base metal layer and the insulating resin layer.

(7) A printed wiring board comprising a metal conductor (wiring) created by forming a resist on at least one face of an insulating substrate and providing a metal on a portion other than the resist (by an additive process),
  wherein a step portion located at a position higher than the insulating substrate level has been previously provided on at least a portion of the insulating substrate where the metal conductor (wiring) is formed, and the metal conductor (wiring) is formed on an upper face of the step portion.

(8) A printed wiring board comprising a metal conductor (wiring) created by forming a base metal layer on at least one face of an insulating substrate, forming a resist on the base metal layer, providing a metal on a portion other than the resist, removing the resist, and removing the base metal layer except for the portion thereof that is to be the metal conductor (wiring) (by a semi-additive process),
  wherein a step portion located at a position higher than the insulating substrate level has been previously provided on at least a portion of the insulating substrate where the metal conductor (wiring) is formed, the base metal layer is formed on an upper face of the step portion, and the metal conductor (wiring) is formed on the base metal layer.

(9) A printed wiring board comprising a metal conductor (wiring) created by forming an insulating resin layer on at least one face of an insulating substrate, forming a resist on the insulating resin layer, and providing a metal on a portion other than the resist (by an additive process),
  wherein a step portion located at a position higher than the insulating substrate level has been previously provided on at least a portion of the insulating resin layer where the metal conductor (wiring) is formed and the metal conductor (wiring) is formed on an upper face of the step portion.

(10) A printed wiring board comprising a metal conductor (wiring) created by forming an insulating resin layer on at least one face of an insulating substrate, forming a base metal layer on the insulating resin layer, forming a resist on the base metal layer, providing a metal on a portion other than the resist, removing the resist, and removing the base metal layer except for the portion thereof that is to be the metal conductor (wiring) (by a semi-additive process),
  wherein a step portion located at a position higher than the insulating substrate level has been previously provided on a portion of the insulating resin layer where the base metal layer is formed, the base metal layer is formed on an upper face of the step portion, and the metal conductor (wiring) is formed on the base metal layer.

As the insulating substrate of the present invention, a glass substrate, a silicon substrate, a fiberglass reinforced resin substrate, an aramid fiber reinforced resin substrate, or a ceramic substrate is suitable.

With respect to insulating resin that forms the insulating resin layer or the protective insulating layer, or the step portion in the present invention, resins mainly composed of epoxy resin, polyimide, cardo resin, and BCB (benzocyclobutene) are suitable. However, the choice of resin is not particularly limited to these options as long as the resin in question has an insulating property.

DETAILED DESCRIPTION OF THE INVENTION

Next, the embodiment of the present invention will be explained by way of the drawings. However, for convenience of explanation, a Comparative Embodiment will be first described, and then Embodiments 1 to 8 of the present invention will be described using the drawings.

Comparative Embodiment 1

Figure 9:
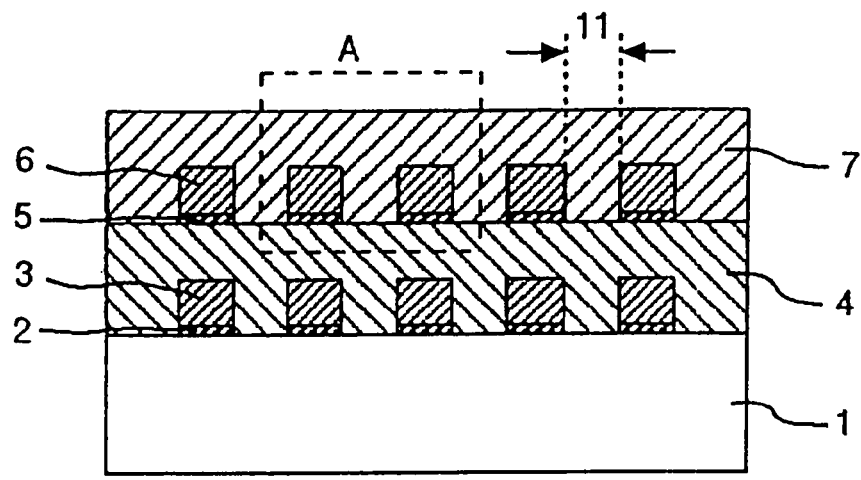
FIG. 9 is a schematic cross-sectional view of a conventional printed wiring board.
Figure 10:
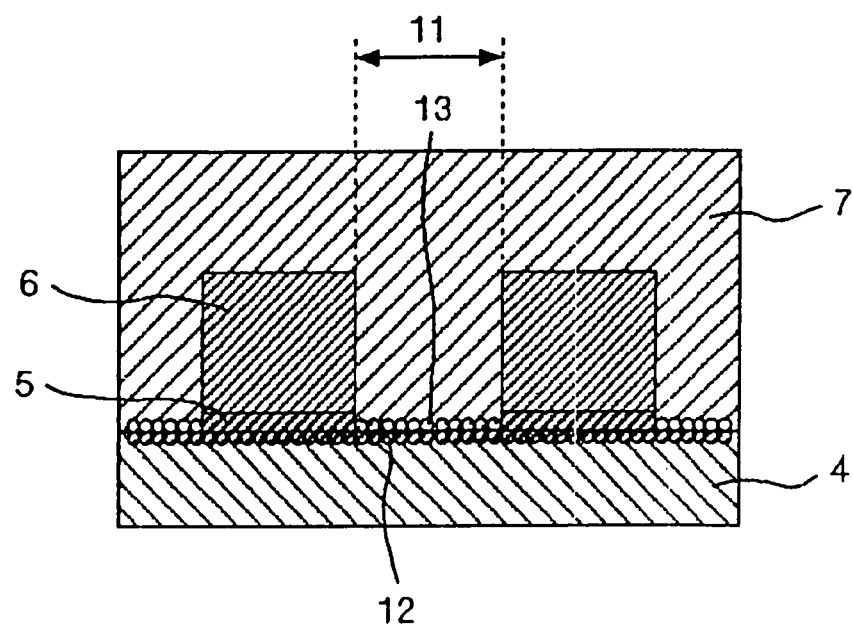
FIG. 10 is an enlarged view of Portion A of the printed wiring board described in FIG. 9.
Figure 11:
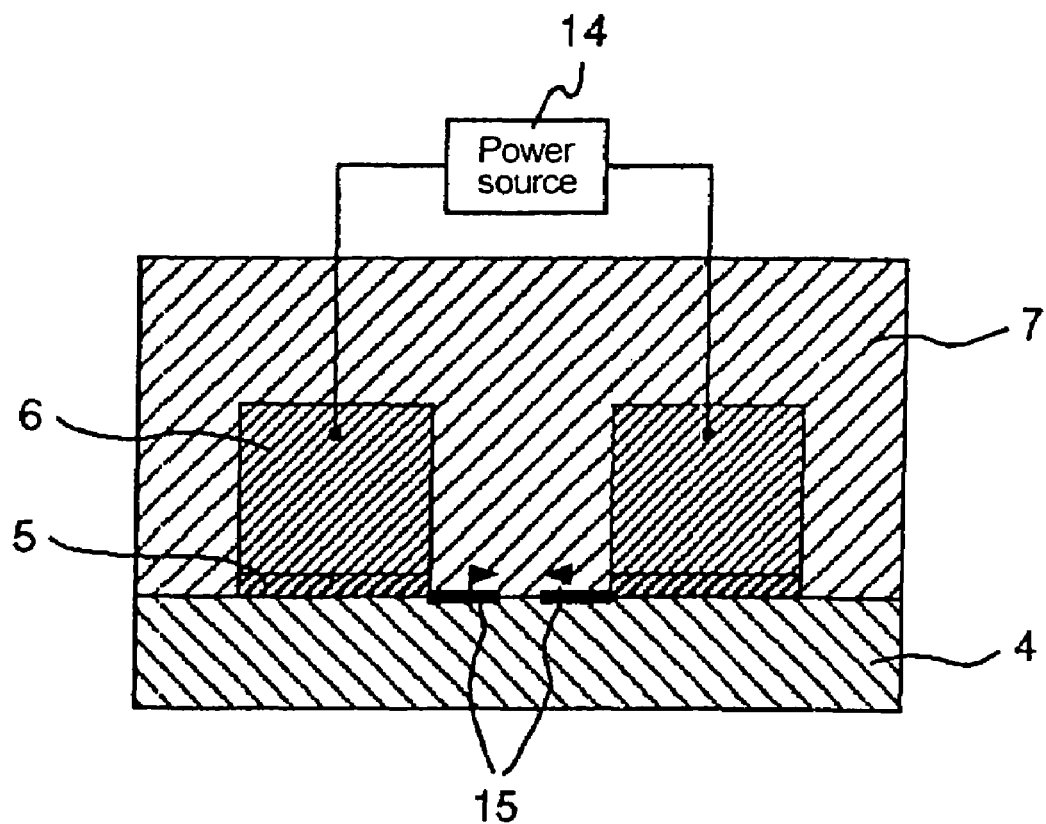
FIG. 11 is an enlarged view of Portion A of the printed wiring board described in FIG. 9.

FIG. 9 is a schematic cross-sectional view of a printed wiring board of the comparative embodiment (conventional example). In FIG. 9, an interface between an insulating resin layer 4 and a protective insulating layer 7 existing in spaces 11 between metal conductors (wiring) was provided at the same height level as the boundary face between the base metal layers 5 and the insulating resin layer 4.

Embodiment 1

Figure 1:
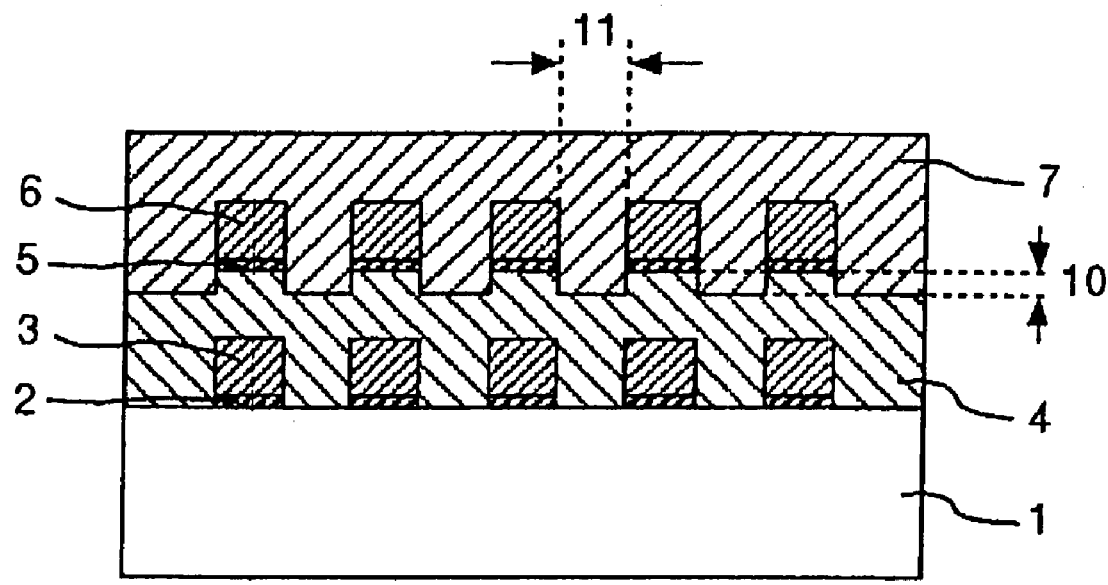
FIG. 1 is a schematic cross-sectional view of a printed wiring board of Embodiment 1.

FIG. 1 is a schematic cross-sectional view of a printed wiring board of the present embodiment. The upper part of an insulating resin layer 4 existing in spaces 11 between metal conductors (wiring) was formed at a position lower than the boundary face between the under surface of a base metal layer 5 and the upper face of the insulating resin layer 4, and a protective insulating layer 7 was formed on the top thereof.

Namely, the interface between the protective insulating layer 7 and the insulating resin layer 4 existing in spaces 11 between metal conductors (wiring) was at a lower position by a level difference 10 than the boundary face between the base metal layer 5 and the insulating resin layer 4.

Figure 12:
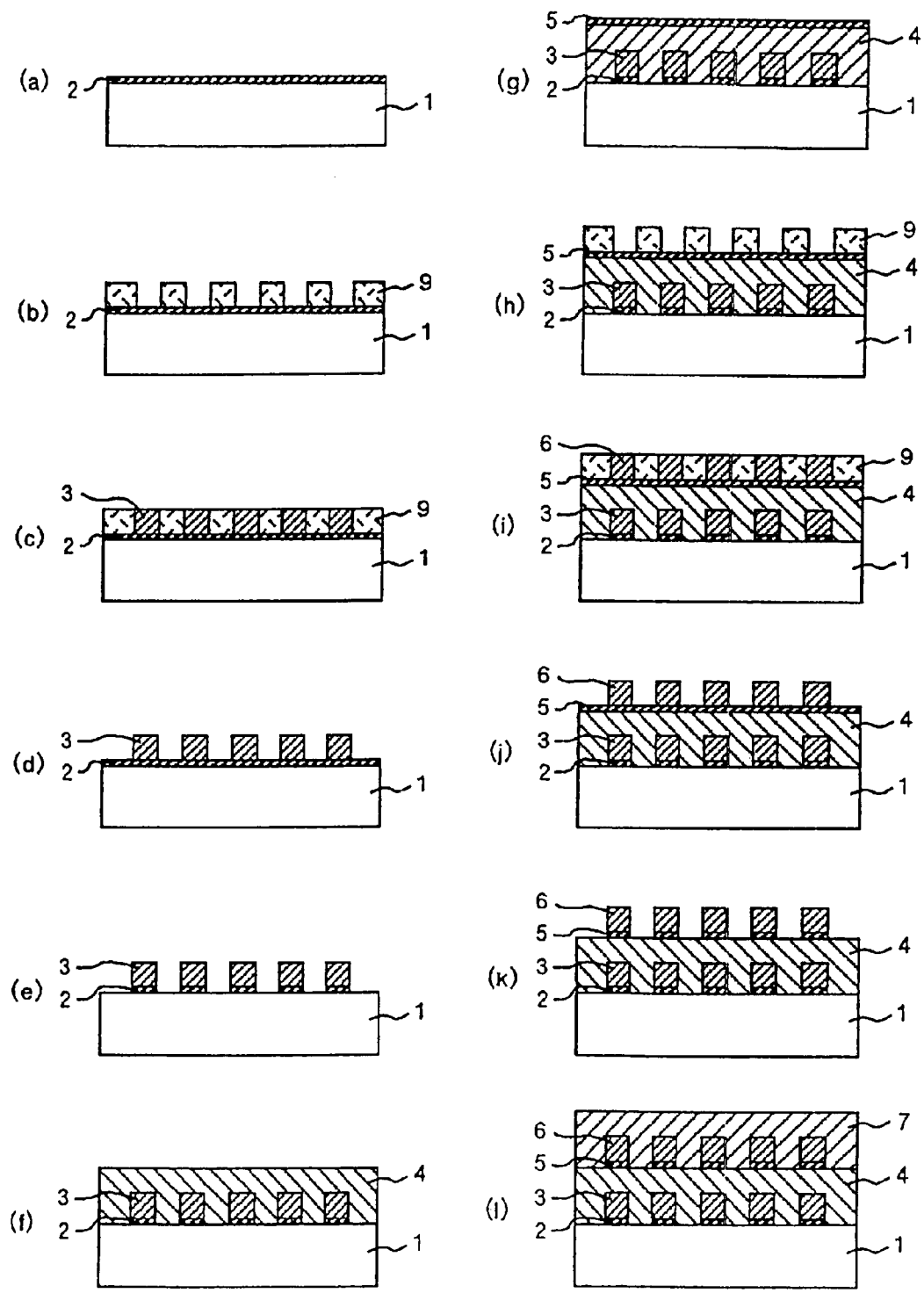
FIG. 12 is a schematic cross-sectional view illustrating one example of a method for producing a conventional printed wiring board.
Figure 13:
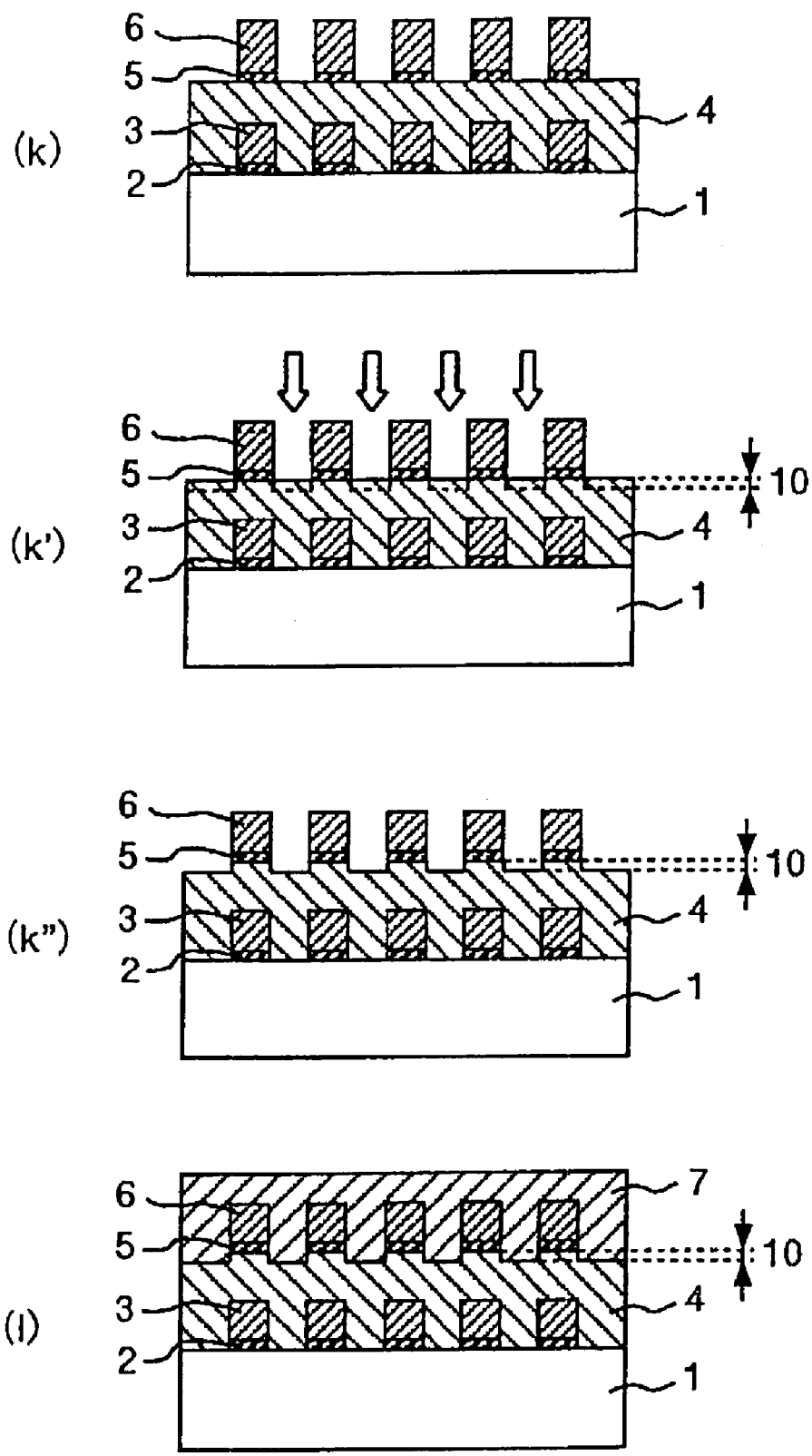
FIG. 13 is a schematic cross-sectional view illustrating one example of a method for producing a printed wiring board of the present invention.

FIG. 13 is an additional process chart including additional processes taking place after process (k) of a conventional process shown in FIG. 12 so that the upper portion of the insulating resin layer 4 existing in spaces 11 between metal conductors was made at a lower position than the boundary face between the base metal layer 5 and the insulating resin layer 4.

In other words, the upper face of the insulating resin layer 4 existing in spaces between metal conductors 11 and the upper face (chain line part) of the metal conductors 6 were subjected to dry-etching by a dry-etching apparatus, as shown in FIG. 13 (k)'. Accordingly, the upper face of the insulating resin layer 4 existing in spaces between metal conductors 11 was formed at a position lower by a level difference 10 than the boundary face between the base metal layer 5 and the insulating resin layer 4. Then, the level difference 10 was measured and found to be approximately 100 nm.

Thereafter, in the process (1), the protective insulating layer 7 was formed, and then the printed wiring board was finished. Incidentally, besides dry-etching, processing by an ion beam, a laser, or ashing equipment, etching by chemical agents or the like may be employed as a method of forming the upper face of the insulating resin layer 4 existing in spaces between the metal conductors 11 at a lower position than the boundary face between the base metal layer 5 and the insulating resin layer 4. The method is not particularly limited as long as it enables the removal of a part of the insulating resin layer 4.

Herein, the step portion 10 improves the initial value of insulation resistance and anti-migration property, though the height of the step portion is preferably 50 nm or more, and more preferably 100 nm or more.

Embodiment 2

Figure 2:
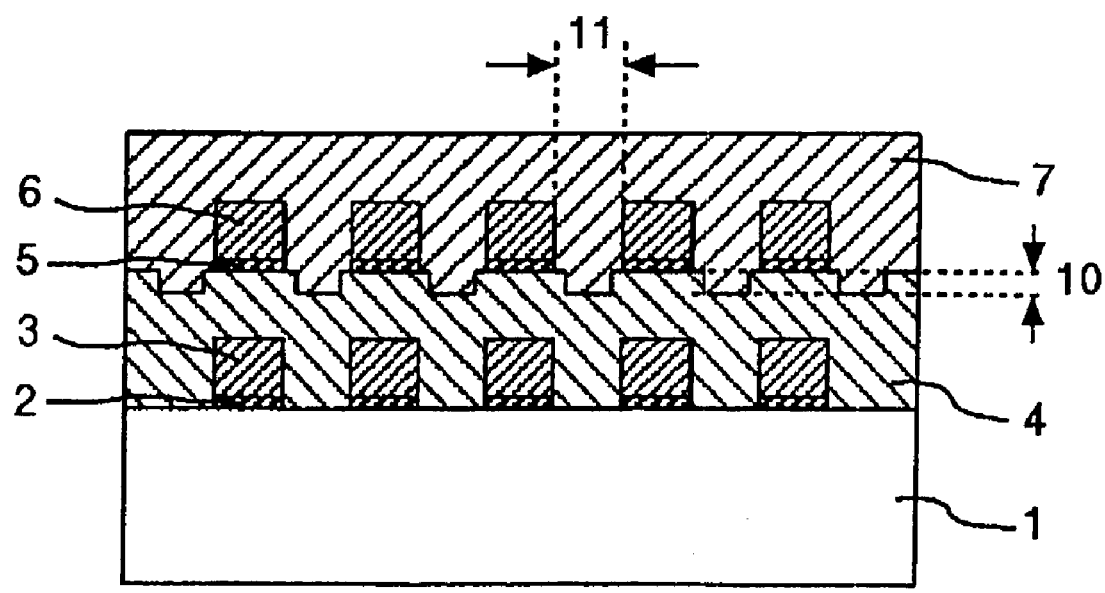
FIG. 2 is a schematic cross-sectional view of a printed wiring board of Embodiment 2.

FIG. 2 is a schematic cross-sectional view of a printed wiring board of this embodiment. A central part of an upper face of an insulating resin layer 4 existing in spaces between metal conductors 11 was removed by ion beam processing so as to be lower than the boundary face between a base metal layer 5 and the insulating resin layer 4, and a protective insulating layer 7 was formed on the top thereof.

A part of the interface between the protective insulating layer 7 and the insulating resin layer 4 existing in spaces 11 between metal conductors (wiring) was provided at a lower position by a level difference 10 than the boundary face between the base metal layer 5 and the insulating resin layer 4. Here, the level difference 10 was approximately 500 nm.

Embodiment 3

Figure 3:
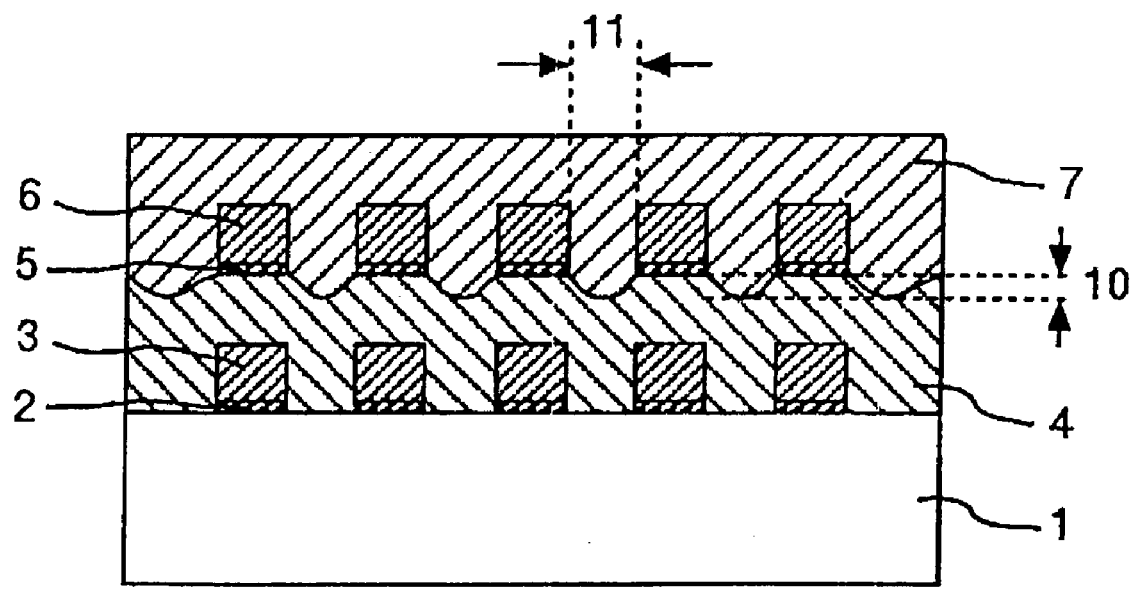
FIG. 3 is a schematic cross-sectional view of a printed wiring board of Embodiment 3.

FIG. 3 is a schematic cross-sectional view of a printed wiring board of this embodiment. A central part of an upper face of an insulating resin layer 4 existing in spaces 11 between metal conductors was removed and formed in a concave shape by a laser processing. The bottom of the concave portion was formed at a position lower than the boundary face between the base metal layer 5 and the insulating resin layer 4, and a protective insulating layer 7 was formed on the top thereof.

A concave-shaped interface between the protective insulating layer 7 and the insulating resin layer 4 existing in spaces between the metal conductors (wiring) was provided at a lower position by a level difference 10 than the boundary face between the base metal layer 5 and the insulating resin layer 4. Here, the level difference 10 was approximately 1 µm.

Embodiment 4

Figure 4:
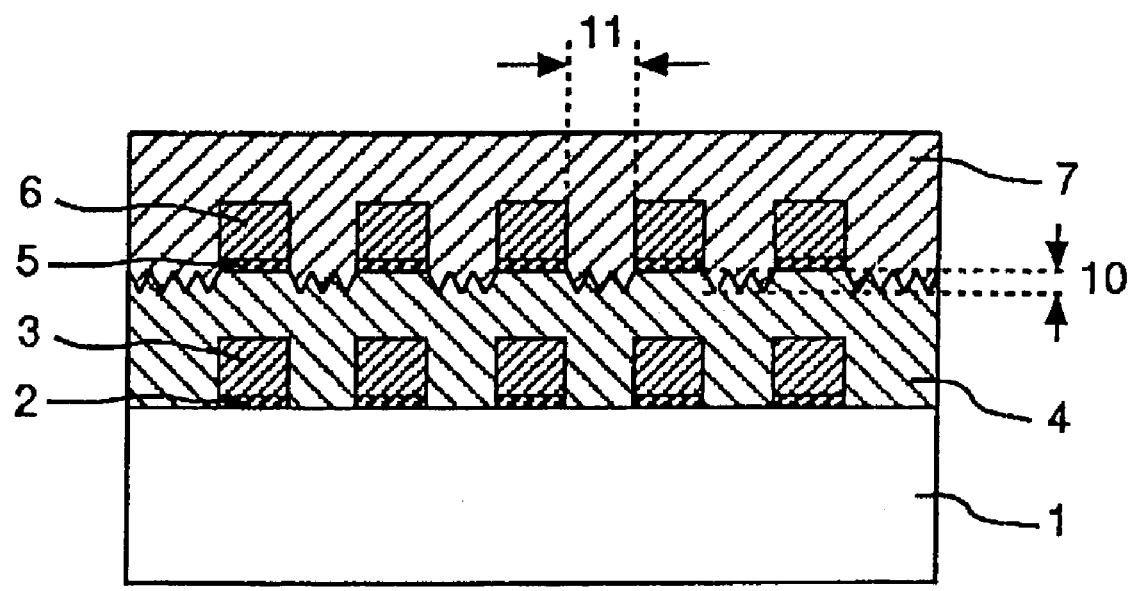
FIG. 4 is a schematic cross-sectional view of a printed wiring board of Embodiment 4.

FIG. 4 is a schematic cross-sectional view of a printed wiring board of this embodiment. Satin-like irregularities were formed on the surface of an insulating resin layer 4 existing in spaces 11 between metal conductors (wiring) by ashing equipment so that the surface of the insulating resin layer was substantially lower than the boundary face between a base metal layer 5 and the insulating resin layer 4. A protective insulating layer 7 was formed on the top thereof.

The satin-like irregularities between the protective insulating layer 7 and the insulating resin layer 4 existing in spaces 11 between the metal conductors (wiring) were formed at a lower position by a level difference 10 than the boundary face between the base metal layer 5 and the insulating resin layer 4. Here, the level difference 10 was approximately 50 nm.

Embodiment 5

Figure 5:
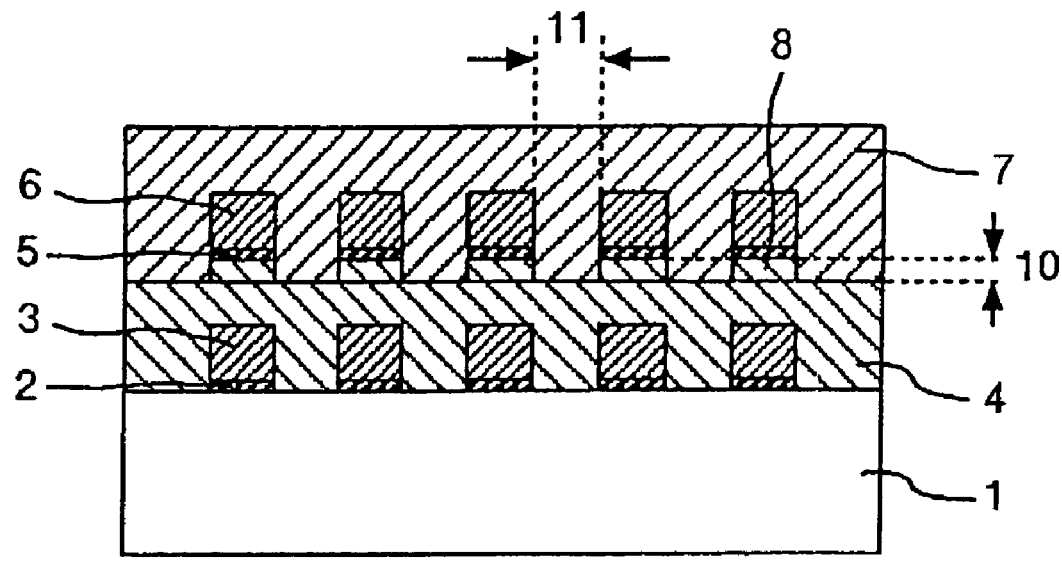
FIG. 5 is a schematic cross-sectional view of a printed wiring board of Embodiment 5.

FIG. 5 is a schematic cross-sectional view of a printed wiring board of this embodiment. A step portion was formed over an insulating resin layer 4 where a metal conductor was to be formed, and a base metal layer 5 and a metal conductor 6 were formed on the upper face of the step portion. Further, a protective insulating layer 7 was formed on the top thereof.

An interface between the protective insulating layer 7 and the insulating resin layer 4 existing in spaces 11 between the metal conductors (wiring) was formed at a lower position by the level difference 10 than the boundary face between the base metal layer 5 and the insulating resin layer 4. Here, the level difference 10 was approximately 1 µm.

Figure 14:
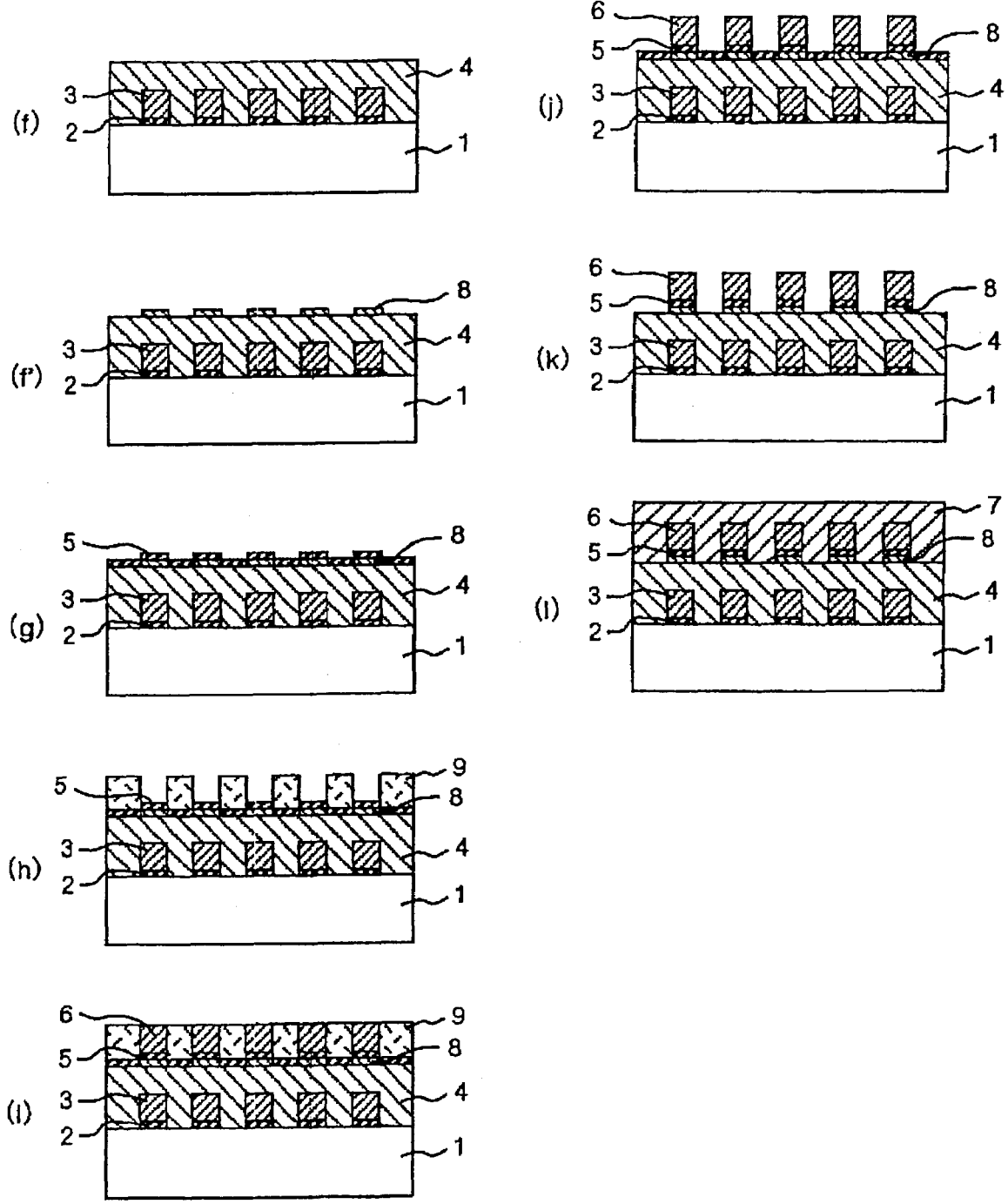
FIG. 14 is a schematic cross-sectional view illustrating one example of a method for producing a printed wiring board of the present invention.

FIG. 14 is a schematic cross-sectional view that illustrates the additional processes after the process (f) of the conventional production process shown in FIG. 12 used to form a step portion 8 corresponding to a portion forming a metal conductor. In other words, the step portion 8 was previously formed of photosensitive polyimide resin at a position where the metal conductor was to be formed in the process (f)' of FIG. 14. Thereafter, the printed wiring board was finished according to the processes (g) to (l).

Here, in addition to photosensitive polyimide resin, resins mainly composed of epoxy resin, polyimide, cardo resin, benxocyclobutene (BCB), or the like may be used for the step portion 8. Further, besides organic substances such as resins, substances having insulation properties, such as inorganic substances, may be usable.

Even when the level difference 10 is small, it contributes to improvements of the initial value of insulation resistance and anti-migration properties. Particularly, the level difference is preferably 50 nm or more, and more preferably 100 nm or more.

Embodiment 6

Figure 6:
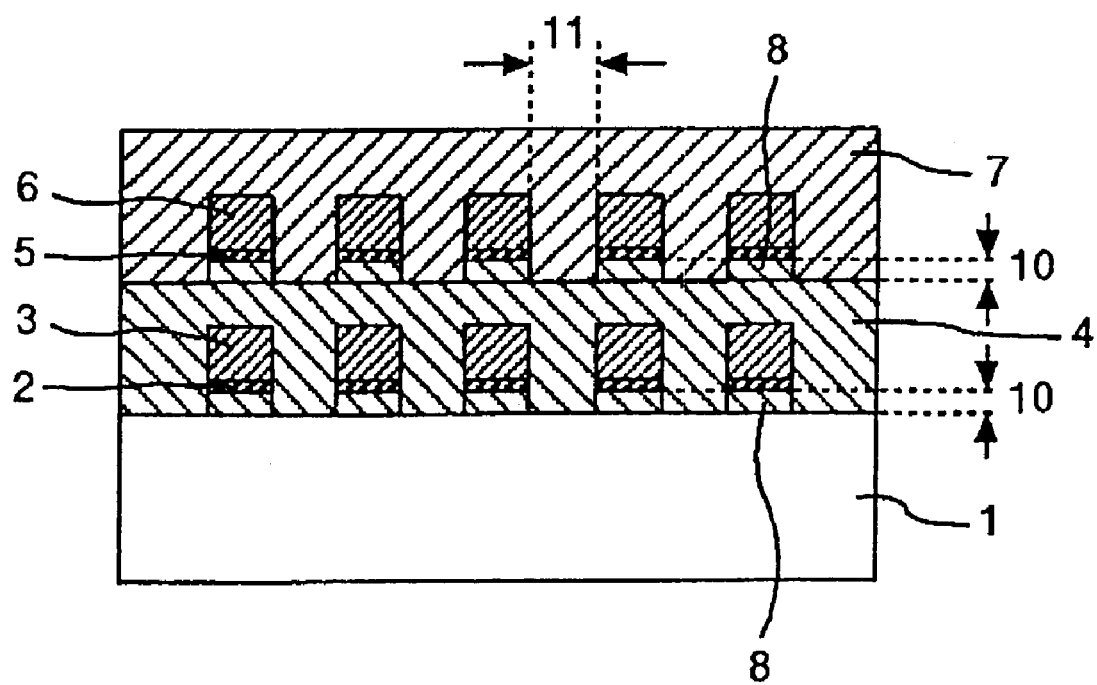
FIG. 6 is a schematic cross-sectional view of a printed wiring board of Embodiment 6.

FIG. 6 is a schematic cross-sectional view of a printed wiring board of this embodiment. A step portion 8 was previously formed at a position of an insulating substrate 1 where a metal conductor was to be formed, and on top of that a base metal layer 2 and a metal conductor 3 were formed. An insulating resin layer 4 (interlayer insulating layer) was formed thereon. Then, the wiring of a second layer was formed in the same manner as that in Embodiment 5.

An interface between the insulating resin layer 4 (interlayer insulating layer) and the insulating substrate 1 existing in spaces 11 between the metal conductors (wiring) was provided at a lower position by a level difference 10 than the boundary face between the base metal layer 2 and the step portion 8. Further, an interface between an protective insulating layer 7 and the insulating resin layer 4 existing in spaces 11 between the metal conductors (wiring) was provided at a lower position by a level difference 10 than the boundary face between the base metal layer 5 and the step portion 8. Here the level difference 10 was approximately 1 µm.

Embodiment 7

Figure 7:
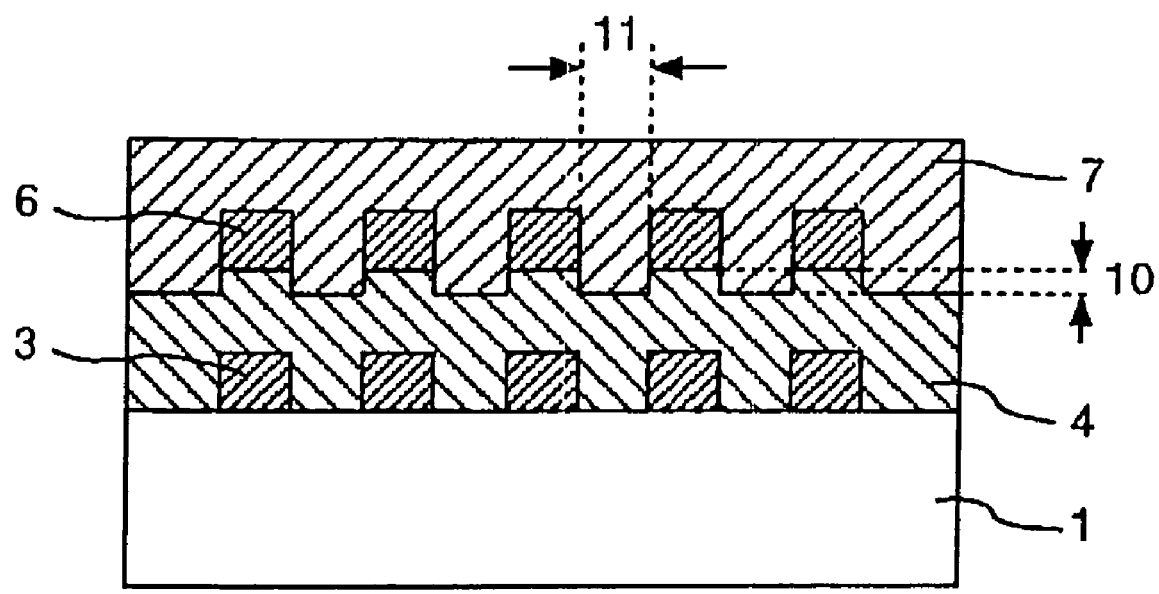
FIG. 7 is a schematic cross-sectional view of a printed wiring board of Embodiment 7.

FIG. 7 is a schematic cross-sectional view of a printed wiring board of this embodiment. The printed wiring board of this embodiment is the same as that of Embodiment 1 shown in FIG. 1 except that base metal layers 2 and 5 were not provided. An interface between a protective insulating layer 7 and an insulating resin layer 4 existing in spaces 11 between the metal conductors (wiring) was provided at a lower position by a level difference 10 than the boundary face between the metal conductor 6 and the insulating resin layer 4. Here, the level difference 10 was approximately 100 nm.

Embodiment 8

Figure 8:
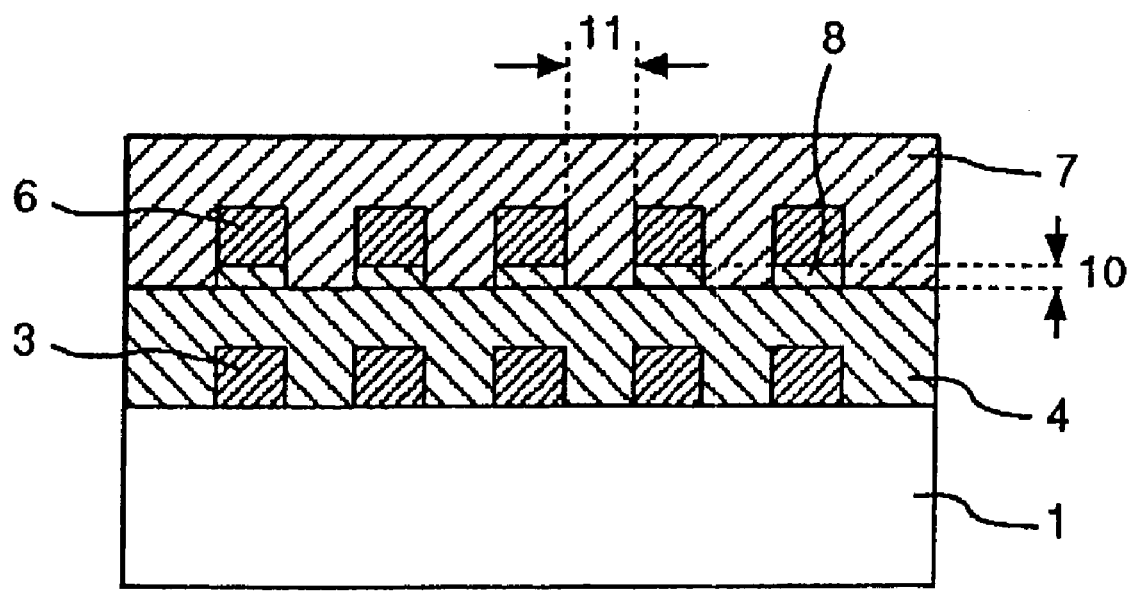
FIG. 8 is a schematic cross-sectional view of a printed wiring board of Embodiment 8.

FIG. 8 is a schematic cross-sectional view of a printed wiring board of this embodiment. The printed wiring board of this embodiment is the same as that of Embodiment 1 shown in FIG. 1 except that base metal layers 2 and 5 were not provided. An interface between a protective insulating layer 7 and insulating resin layer 4 existing in spaces 11 between metal conductors (wiring) was provided at a lower position by a level difference 10 than a boundary face between the metal conductor 6 and a step portion 8. Here, the level difference was approximately 1 µm.

[Insulation reliability evaluation test]

Initial values of insulation resistance of spaces 11 between the metal conductors (wiring) and results of environmental accelerated tests that were performed as evaluations for insulation reliability in high temperatures and highly humid environments are shown in Table 1. Here, the configuration of electrodes of printed wiring boards used for evaluation comprised 10 pairs of comb-shaped electrodes, and the distance of the spaces 11 between the metal conductors (wiring) was 10 µm.

The initial value of insulation resistance is indicated as an insulation resistance value obtained 1 minute after 100 V voltage was applied to the spaces 11 between the metal conductors (wiring). Additionally, the conditions for the environmental accelerated tests were 85° C./85% RH, and 20 V voltage was applied to the spaces between metal conductors (wiring).

of the present invention. Electrodes of a printed wiring board 16 according to any one of the embodiments 1 to 8 were electrically connected to output terminals of a semiconductor (IC) chip 17, a resistor 18, and a condenser 19 by connecting members, such as a projecting electrode 21 (gold bump) and soldering 22. Then, the chip, resistor, condenser, and connecting members were sealed with a sealing resin 23

TABLE 1

| | | Substrate structure | Wiring layer | Initial insulation resistance (Ω) | Insulation resistance after accelerated aging test (Ω) | | | | |
|---|---|---|---|---|---|---|---|---|---|
| | | | | | After 100 h | After 200 h | After 300 h | After 500 h | After 1,000 h |
| Embodiments | 1 | FIG. 1 | 1 | >1 × 10$^{12}$ | 7.9 × 10$^{10}$ | 6.4 × 10$^{10}$ | 4.6 × 10$^{10}$ | 2.3 × 10$^{10}$ | 7.9 × 10$^{9}$ |
| | | | 2 | " | 1.8 × 10$^{11}$ | 8.9 × 10$^{10}$ | 7.9 × 10$^{10}$ | 6.2 × 10$^{10}$ | 3.9 × 10$^{10}$ |
| | 2 | FIG. 2 | 1 | " | 7.6 × 10$^{10}$ | 6.2 × 10$^{10}$ | 4.2 × 10$^{10}$ | 2.3 × 10$^{10}$ | 8.5 × 10$^{9}$ |
| | | | 2 | " | 2.2 × 10$^{11}$ | 1.1 × 10$^{11}$ | 9.8 × 10$^{10}$ | 8.2 × 10$^{10}$ | 6.0 × 10$^{10}$ |
| | 3 | FIG. 3 | 1 | " | 8.2 × 10$^{10}$ | 6.9 × 10$^{10}$ | 4.9 × 10$^{10}$ | 3.1 × 10$^{10}$ | 8.6 × 10$^{9}$ |
| | | | 2 | " | 1.9 × 10$^{11}$ | 9.9 × 10$^{10}$ | 8.5 × 10$^{10}$ | 7.0 × 10$^{10}$ | 4.9 × 10$^{10}$ |
| | 4 | FIG. 4 | 1 | " | 7.8 × 10$^{10}$ | 6.3 × 10$^{10}$ | 4.8 × 10$^{10}$ | 2.3 × 10$^{10}$ | 8.7 × 10$^{9}$ |
| | | | 2 | " | 9.2 × 10$^{10}$ | 8.1 × 10$^{10}$ | 6.9 × 10$^{10}$ | 4.7 × 10$^{10}$ | 2.3 × 10$^{10}$ |
| | 5 | FIG. 5 | 1 | " | 8.1 × 10$^{10}$ | 6.9 × 10$^{10}$ | 5.3 × 10$^{10}$ | 3.6 × 10$^{10}$ | 9.3 × 10$^{9}$ |
| | | | 2 | " | 1.2 × 10$^{11}$ | 9.0 × 10$^{10}$ | 7.9 × 10$^{10}$ | 8.1 × 10$^{10}$ | 5.0 × 10$^{10}$ |
| | 6 | FIG. 6 | 1 | " | 8.5 × 10$^{10}$ | 7.6 × 10$^{10}$ | 7.0 × 10$^{10}$ | 4.9 × 10$^{10}$ | 2.3 × 10$^{10}$ |
| | | | 2 | " | 7.7 × 10$^{10}$ | 7.1 × 10$^{10}$ | 6.6 × 10$^{10}$ | 4.9 × 10$^{10}$ | 3.7 × 10$^{10}$ |
| | 7 | FIG. 7 | 1 | " | 7.6 × 10$^{10}$ | 6.3 × 10$^{10}$ | 4.8 × 10$^{10}$ | 2.2 × 10$^{10}$ | 7.6 × 10$^{9}$ |
| | | | 2 | " | 7.9 × 10$^{10}$ | 7.2 × 10$^{10}$ | 6.5 × 10$^{10}$ | 5.5 × 10$^{10}$ | 4.0 × 10$^{10}$ |
| | 8 | FIG. 8 | 1 | " | 7.9 × 10$^{10}$ | 6.7 × 10$^{10}$ | 5.9 × 10$^{10}$ | 3.4 × 10$^{10}$ | 9.6 × 10$^{9}$ |
| | | | 2 | " | 8.2 × 10$^{10}$ | 7.0 × 10$^{10}$ | 6.2 × 10$^{10}$ | 4.9 × 10$^{10}$ | 2.2 × 10$^{10}$ |
| Comparative Embodiment | | FIG. 9 | 1 | " | 8.0 × 10$^{10}$ | 6.5 × 10$^{10}$ | 5.1 × 10$^{10}$ | 2.9 × 10$^{10}$ | 8.9 × 10$^{9}$ |
| | | | 2 | 6.8 × 10$^{8}$ | 1.0 × 10$^{8}$ | 8.3 × 10$^{7}$ | 7.8 × 10$^{7}$ | <1 × 10$^{6}$ | <1 × 10$^{8}$ |

As shown in Table 1, the second layer of the conventional printed wiring board according to Comparative Embodiment 1 had a lower insulation resistance of 6.8×10$^{8}$ Ω (the previously mentioned first major problem). In the environmental accelerated test, ion migration took place, and with the passage of 500 hours following the start of the test the insulation resistance thereof became less than the lower evaluation limit of 1×10$^{6}$ Ω, which was regarded as constituting a short circuit (the previously mentioned second major problem).

In contrast, Embodiments 1 to 8 had an initial value of insulation resistance of greater than 1×10$^{12}$ Ω and thus good results were obtained. Further, in the environmental accelerated tests, with the passage of 1,000 hours following the start of the tests they had a resistance of 10$^{9}$ Ω or more and thus good results were obtained.

Embodiment 9

Figure 15:
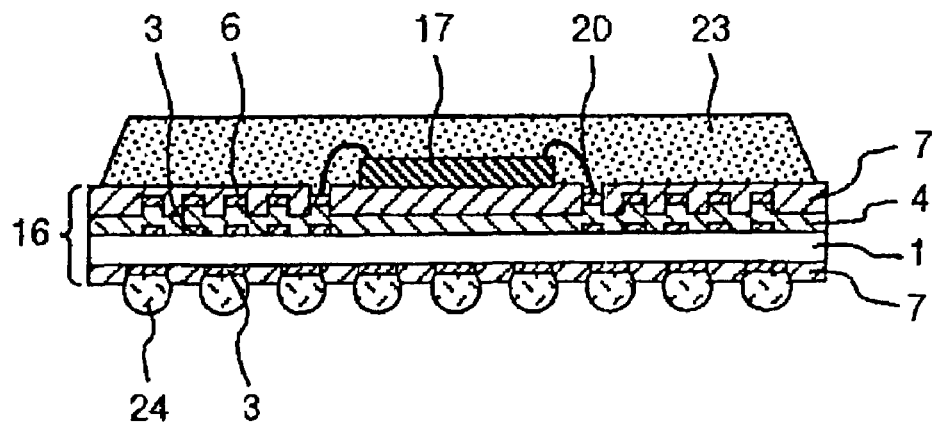
FIG. 15 is a schematic cross-sectional view illustrating a structure of a semiconductor device according to Embodiment 9 of the present invention.

FIG. 15 is a schematic cross-sectional view of a semiconductor device using the printed wiring board of these embodiments of the present invention. On a printed wiring board 16 according to any one of Embodiments 1 to 8, a semiconductor (IC) chip 17 was mounted. A chip output terminal was electrically connected to an electrode of the printed wiring board by a connecting member, for example a thin metallic wire 20, and the chip and connecting member were sealed with a sealing resin 23 such as epoxy resin. Further, an external electrode 24 was formed on an under surface of the printed wiring board with a soldering ball, etc. The semiconductor device herein had the configuration as described above.

Embodiment 10

Figure 16:
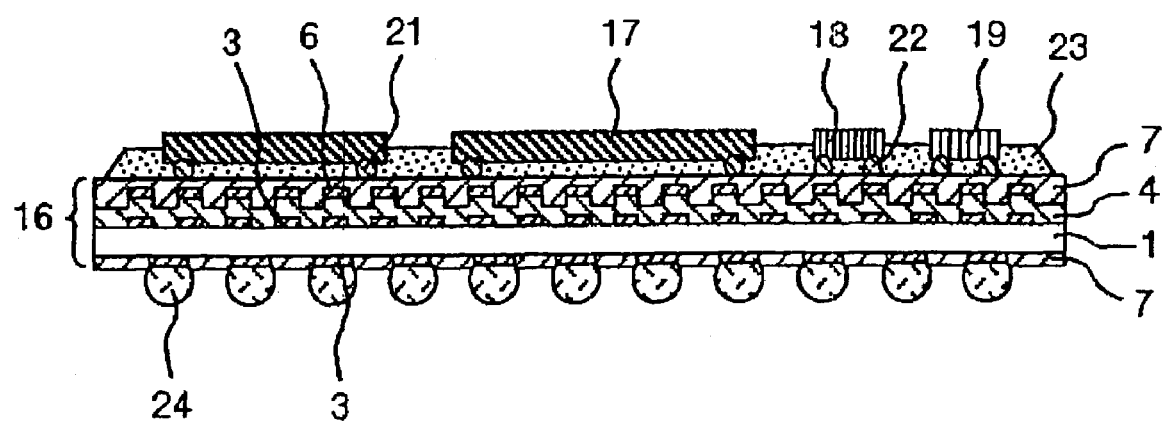
FIG. 16 is a schematic cross-sectional view illustrating a structure of a multi chip module according to Embodiment 10 of the present invention.

FIG. 16 is a schematic cross-sectional view of a multi chip module using the printed wiring board of these embodiments such as epoxy resin, and further external electrodes 24 were formed on an under surface of the printed wiring board with soldering ball, etc. The multi chip module herein had the configuration as described above.

EFFECT OF THE INVENTION

According to the present invention, there is almost no influence attributable to remaining base metal layers such as chrome, or ionic impurities generated from chemical residues such as plating liquids and etchants, and thereby a printed wiring board having high insulation resistance between wirings can be obtained.

Further, since the resin interface interval distance is larger than the wiring interval distance, the occurrence of ion migration to an insulating resin interface is inhibited even in high temperatures and highly humid environments and thereby it is possible to obtain a highly reliable printed wiring board that is unlikely to cause leakage or short circuits.

Furthermore, since ion migration does not occur, it is possible to provide a high-density printed wiring board having finer wiring intervals.

What is claimed is:
1. A semiconductor device comprising:
   a wiring board having a main surface, a plurality of wirings formed on the main surface, and an insulating layer formed over the main surface such that the insulating layer covers the plurality of wirings;
   a semiconductor chip mounted over the insulating layer;
   a plurality of wires electrically connecting the semiconductor chip with a part of each of the plurality of wirings respectively,
   wherein the part of each of the plurality of wirings is exposed from the insulating layer; and a sealing resin for sealing the semiconductor chip, and the plurality of wirings, wherein the sealing resin is formed over the main surface of the wiring board by connecting with the insulating layer, wherein the insulating layer is formed between adjacent wiring; and wherein an interface of the main surface of the wiring board and the insulating layer formed between adjacent wirings is formed at a position lower than an interface of the main surface of the wiring board and each of the plurality of wirings.

2. A semiconductor device according to claim 1, wherein the wiring board has a back surface opposed to the main surface, and the plurality of metal conductors formed on the back surface, and wherein a plurality of external electrodes are formed over the plurality of metal conductors respectively.

3. A semiconductor device according to claim 1, wherein the wiring board has a plurality of base metal layers formed on the main surface, wherein the plurality of wirings formed over the plurality of base metal layers respectively, and wherein the interface of the main surface of the wiring board and the insulating layer formed between adjacent wirings is formed at a position lower than an interface of the main surface of the wiring board and each of the base metal layers.

* * * * *